United States Patent
Kurano et al.

(10) Patent No.: US 6,617,762 B2
(45) Date of Patent: Sep. 9, 2003

(54) MICROACTUATOR DEVICE WITH A COUNTERMEASURE FOR PARTICLES ON A CUT FACE THEREOF

(75) Inventors: Masayuki Kurano, Hyogo (JP); Tadahiko Horiguchi, Sendai (JP)

(73) Assignees: NEC Tokin Ceramics Corporation, Shiso-gun (JP); NEC Tokin Corporation, Sendai (JP)

( * ) Notice: Subject to any disclaimer, the term of this patent is extended or adjusted under 35 U.S.C. 154(b) by 0 days.

(21) Appl. No.: 09/921,319

(22) Filed: Aug. 2, 2001

(65) Prior Publication Data

US 2002/0014815 A1 Feb. 7, 2002

(30) Foreign Application Priority Data

Aug. 3, 2000 (JP) ........................................ 2000-235707

(51) Int. Cl.$^7$ ................................................ H01L 41/08
(52) U.S. Cl. .................. 310/328; 360/294.4; 360/294.6
(58) Field of Search ...................... 310/328; 360/294.4, 360/294.6

(56) References Cited

U.S. PATENT DOCUMENTS

| | | | | |
|---|---|---|---|---|
| 5,189,578 A | * | 2/1993 | Mori et al. ............... | 360/294.6 |
| 6,002,549 A | * | 12/1999 | Berman et al. .......... | 360/294.4 |
| 6,052,251 A | * | 4/2000 | Mohajerani et al. ..... | 360/78.05 |
| 6,157,522 A | * | 12/2000 | Murphy et al. .......... | 360/294.6 |
| 6,233,124 B1 | * | 5/2001 | Budde et al. ............. | 360/294.4 |
| 6,278,587 B1 | * | 8/2001 | Mei ........................ | 360/294.6 |
| 6,310,750 B1 | * | 10/2001 | Hawwa et al. ........... | 360/294.6 |
| 6,331,923 B1 | * | 12/2001 | Mei ........................ | 360/294.4 |
| 6,335,848 B1 | * | 1/2002 | Mei ........................ | 360/294.4 |
| 6,362,933 B1 | * | 3/2002 | Sampietro et al. .......... | 360/110 |
| 6,411,475 B1 | * | 6/2002 | Khan et al. ............... | 360/294.4 |

FOREIGN PATENT DOCUMENTS

| | | | | |
|---|---|---|---|---|
| JP | 62-88382 | * | 4/1987 | .................. 310/328 |
| JP | 2000-163892 | * | 6/2000 | ........... G11B/21/02 |
| JP | 2001-126423 | * | 5/2001 | ........... G11B/21/10 |
| JP | 2002-184141 | * | 6/2002 | ........... G11B/21/10 |

* cited by examiner

Primary Examiner—Thomas M. Dougherty
(74) Attorney, Agent, or Firm—Frishauf, Holtz, Goodman & Chick, P.C.

(57) ABSTRACT

In a microactuator device (2) having a cut face formed by cutting or splitting, the cut face is subjected to anti-release treatment for preventing release of particles produced by cutting. The microactuator device may have a multilayer structure including a plurality of piezoelectric elements and a plurality of internal electrodes alternately laminated. In this case, the multilayer structure has the above-mentioned cut face. It is preferable that the microactuator device is mounted between a base plate (3) to be fixed and a support spring (5) for supporting a head (4), and that the microactuator device and portions of the base plate and the support spring which are adjacent to the microactuator device are collectively coated with a coating film.

7 Claims, 6 Drawing Sheets

MICROACTUATOR DEVICE WITH A COUNTERMEASURE FOR PARTICLES ON A CUT FACE THEREOF

BACKGROUND OF THE INVENTION

This invention relates to a microactuator device comprising a multilayer structure including a plurality of piezoelectric elements and a plurality of internal electrodes alternately laminated and to a technique utilizing the microactuator device.

In various active apparatuses known in the art, use has been made of a microactuator device comprising a multilayer structure including a plurality of thin planar piezoelectric elements and a plurality of thin planar internal electrodes alternately laminated.

In the above-mentioned microactuator device, the internal electrodes are alternately exposed on opposite side surfaces of the multilayer structure to be connected to a pair of external electrodes formed on the opposite side surfaces, respectively. Typically, the internal electrodes and the external electrodes are formed by sputtering. After the external electrodes are formed on the multilayer structure, sintering or baking is carried out.

In case where the microactuator device is desired to have a small size, a large-sized structure is preliminarily prepared, baked, and then cut along a plane perpendicular to the external electrodes to obtain the microactuator device having a predetermined size. Taking into account the improvement in masking efficiency upon sputtering and the reduction in working cost also, it is advantageous to cut the large-sized structure into the predetermined size after baking.

Therefore, the microactuator device of the type is often used in a cut or split state. In this event, the microactuator device inevitably has a cut face in a split-faced condition. Herein, the term "split-faced" means that the cut face is left as it is without being treated by a particular manner.

In the microactuator device mentioned above, small cracks or chips may possibly be caused during cutting. In this event, it is inevitable that free particles or potential free particles comprising a piezoelectric material or an electrode material are adhered to and exposed on the cut face in the split-faced condition. Therefore, when the microactuator device is attached to the active apparatus, those particles may be detached and dropped off from the cut face due to vibration or extension/contraction of the active apparatus. The particles detached and dropped off may inhibit a predetermined operation of the active apparatus or damage an article or object used in the active apparatus.

SUMMARY OF THE INVENTION

It is therefore an object of this invention to provide a microactuator device with a countermeasure for particles on a cut face formed by cutting or splitting.

It is another object of this invention to provide a head supporting device capable of preventing release of particles from the microactuator device.

It is still another object of this invention to provide a disk recording apparatus using the above-mentioned microactuator device.

Other objects of the present invention will become clear as the description proceeds.

According to the present invention, there is provided a microactuator device having a cut face formed by cutting, wherein the cut face is subjected to anti-release treatment for preventing release of particles produced by cutting.

According to the present invention, there is provided a head supporting arrangement which comprises a base plate to be fixed, a support spring for supporting a head, and a microactuator device connected to the base plate and the support spring, the microactuator device being coated with a coating film collectively with portions of the base plate and the support spring which are adjacent to the microactuator device.

According to the present invention, there is provided a head supporting arrangement which comprises a base plate to be fixed, a support spring for supporting a head, and a plurality of microactuator devices connected between the base plate and the support spring, the microactuator devices being collectively covered with a coating film.

According to the present invention, there is provided a disk recording apparatus which comprises the head supporting arrangement according to any one of the above-mentioned head supporting arrangements, and a head supported by the support spring of the head supporting arrangement to access to a rotary disk, the microactuator device of the head supporting arrangement carrying out fine adjustment of a positional relationship of the head with respect to the disk.

DESCRIPTION OF THE PREFERRED EMBODIMENTS

Now, several embodiments of this invention will be described in detail with reference to the drawing.

Figure 1:
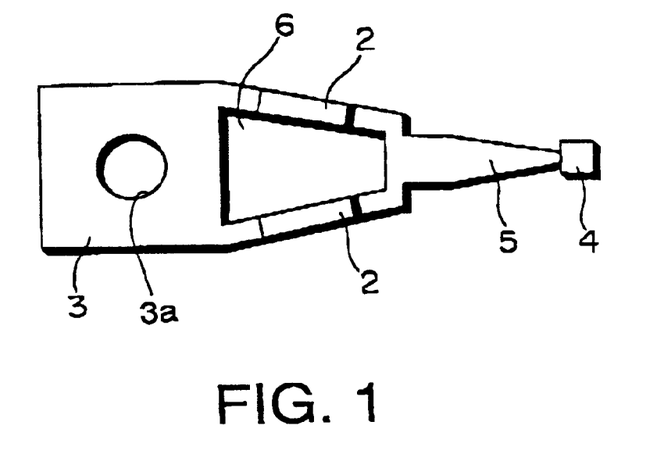
FIG. 1 is a plan view showing a characteristic part of a head supporting arrangement for use in a disk recording apparatus according to one embodiment of this invention.

Referring to FIG. 1, a head supporting arrangement according to one embodiment of this invention is for use in a disk recording apparatus. The head supporting arrangement comprises a base plate 3 to be fixed via a fixing hole 3a, a support spring 5 as a component separate from the base plate 3, and two microactuator devices 2 connecting the support spring 5 to the base plate 3. Each of the microactuator devices 2 is placed on the base plate 3 and the support spring 5 in a bridged condition and fixed to the base plate 3 and the support spring 5 by the use of an adhesive or the like. As a consequence, a combination of the base plate 3, the support spring 5, and the microactuator devices 2 defines a through hole 6 between the microactuator devices 2. At an end of the support spring 5, a head 4 is mounted by bonding or the like. The head 4 serves to access to a recording medium such as a hard disk to carry out reading and writing operations.

Following a predetermined operation of at least one of the microactuator devices 2, the magnetic head 4 is finely displaced in a plane parallel to the sheet of the drawing. It is also possible to finely displace the magnetic head 4 in a direction perpendicular to the recording medium or to the sheet of the drawing. Thus, the magnetic head 4 can be finely adjusted in position.

Figure 2:
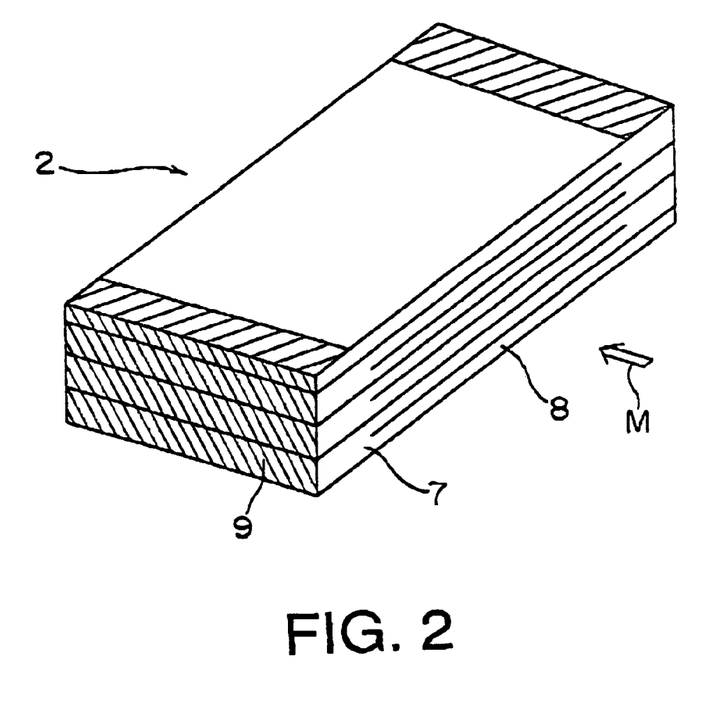
FIG. 2 is a perspective view showing a basic structure of a microactuator device of the head supporting arrangement illustrated in FIG. 1.

Referring to FIG. 2, each of the microactuator device 2 comprises a multilayer structure including a plurality of thin planar piezoelectric elements 7 of a piezoelectric ceramics material and a plurality of thin planar internal electrodes 8 alternately stacked so that the internal electrodes 8 alternately extend to opposite side surfaces of the multilayer structure. On the opposite side surfaces of the multilayer structure, a pair of external electrodes 9 are respectively arranged to be connected to end portions of the internal electrodes 8 exposed as parallel lines. Each of the external electrodes 9 partially extends to opposite surfaces, namely, upper and lower surfaces of the multilayer structure in a layering direction. The microactuator device 2 is cut into a predetermined size (corresponding to a final product shape in the following description) and used in a cut or split state. When the external electrodes 9 are applied with a controlled voltage, the microactuator device 2 carries out a predetermined operation in accordance with a well-known principle.

In the microactuator device 2, a cut face formed by cutting is subjected to anti-release treatment for preventing adhesion and exposure of free particles of a piezoelectric material and an electrode material produced during cutting and for preventing release of potential free particles.

For example, the above-mentioned anti-release treatment is carried out by baking an entire surface of the microactuator device 2 including the cut face to form a sintered surface after cutting into the final product shape. Alternatively, the entire surface including the cut face formed by cutting after baking may be polished. Alternatively, the entire surface including the cut face formed by cutting after baking may be reheated to thereby refix the free particles and the potential free particles to the entire surface. Alternatively, the cut face formed by cutting after baking may be exclusively heated to thereby refix the free particles and the potential free particles to the cut face. For example, only the cut face formed by cutting after baking is heated by laser irradiation to thereby refix material particles to the cut face. In any event, the above-mentioned anti-release treatment is preferably followed by washing of the entire surface including the cut face in order to remove the free particles. Whether or not the anti-release treatment has been performed can easily be discriminated by visual observation through a microscope.

As another anti-release treatment, the cut face formed by cutting after baking is coated with a glass to prevent the cut face from being exposed Alternatively, the entire surface including the cut face formed by cutting after baking is coated with a flexible resin material which hardly suppresses the displacement of the microactuator device 2.

By the anti-release treatment, the free particles are not adhered to or exposed on the cut face or the cut face is completely coated. Therefore, even if the microactuator device is used for driving the head supporting arrangement, the free particles and the potential free particles are not released and a finished condition of the surface of a product or the microactuator device upon manufacture is improved.

When the microactuator devices 2 for driving are attached to the support spring 5 to form the head supporting arrangement, anti-release strengthening treatment may be carried out. Specifically, an entire area of the head supporting arrangement from the base plate 3 to the end of the support spring 5 where the head 4 is bonded is coated with a coating film made of a resin material or the like. With this structure, it is possible to completely prevent the free particles and the potential free particles from being released from the cut face. Thus, those problems causing a damage of the surface of the recording medium can be eliminated more reliably.

The microactuator device 2 illustrated in FIG. 2 may be produced in the following manner. A piezoelectric ceramics green sheet is prepared. By the use of a paste containing 70% Ag and 30% Pd, an internal electrode pattern is printed on the piezoelectric ceramics green sheet by screen printing. On the piezoelectric ceramics green sheet with the internal electrode pattern, another piezoelectric ceramics green sheet is placed and a similar pattern is printed thereon. Subsequently, the similar operation is repeated to obtain the multilayer structure. On the multilayer structure, the electrode material such as gold is deposited by sputtering to form the external electrodes. Thereafter, the multilayer structure is cut into a predetermined shape and a predetermined size.

Figure 3:
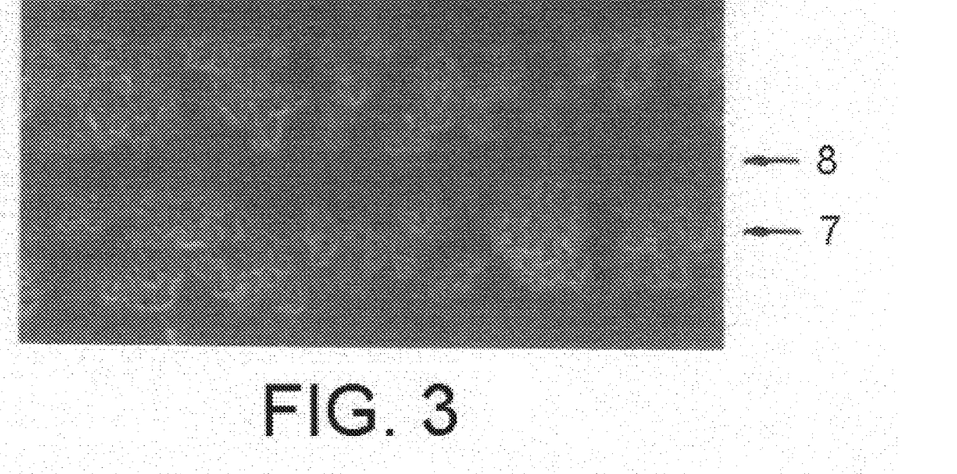
FIG. 3 is a photomicrograph of a cut face of the microactuator device which is not subjected to anti-release treatment.

Referring to FIG. 3, the microactuator device without the anti-release treatment is observed by a scanning electron microscope (SEM) in an observing direction M illustrated in FIG. 2. The microactuator device is obtained by breaking the multilayer structure after baking. As seen from FIG. 3, the free particles and the potential free particles are exposed on the broken face of the microactuator device 2 at the piezoelectric element 7 and the internal electrode 8. Thus, on the broken face obtained by breaking the multilayer structure after baking, not a small amount of the tree particles and the potential free particles are present. This means that a finished condition of the surface of the microactuator device is not excellent.

Figure 4:
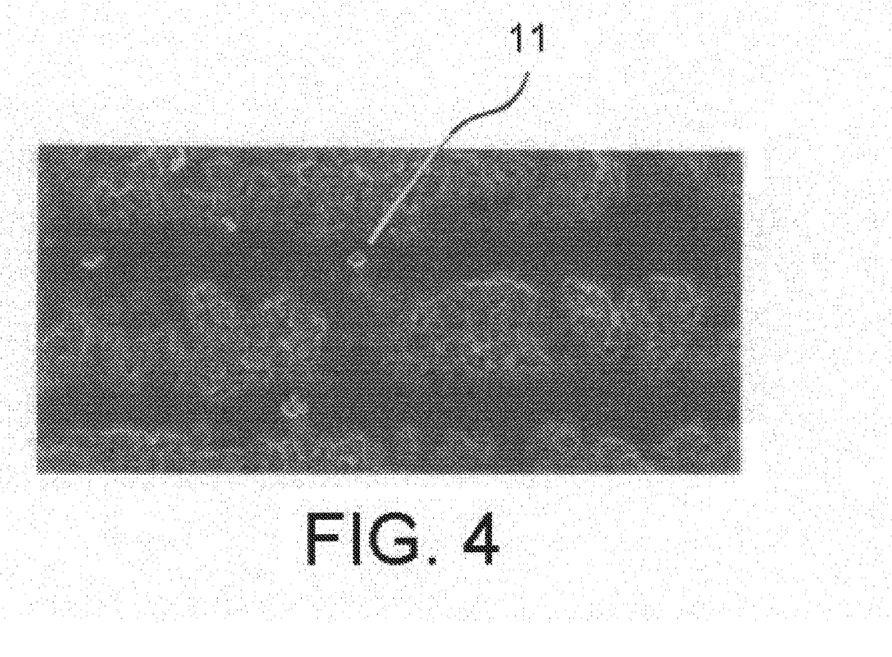
FIG. 4 is an enlarged photomicrograph of a part of the cut face shown in FIG. 3.

Referring to FIG. 4, a part of the cut face of the microactuator device 2 illustrated in FIG. 3 is enlarged. As seen from FIG. 4, it is confirmed that the free particles depicted by 11 are locally present on the microactuator device. Such free particles 11 may be detached from the microactuator device as released particles.

Figure 5:
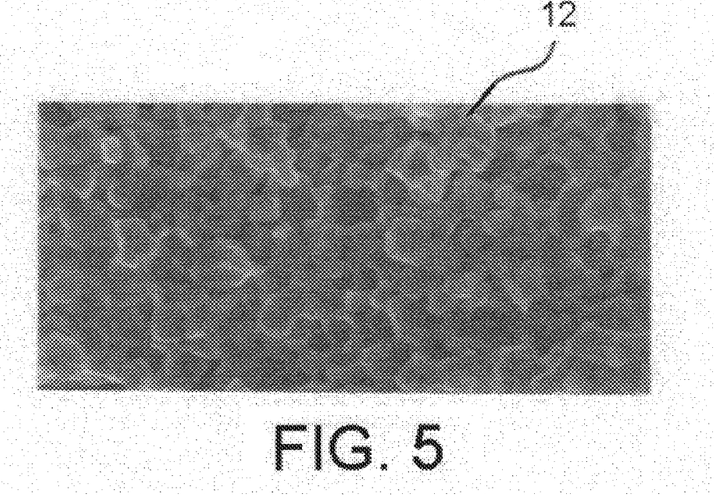
FIG. 5 is an enlarged photomicrograph of a piezoelectric ceramics portion of the cut face shown in FIG. 3.

Referring to FIG. 5, only a part of the cut face of the microactuator device 2 illustrated in FIG. 3 at the piezoelectric ceramics element 7 is enlarged. As seen from FIG. 5, it is confirmed that the potential free particles 12 are present on the piezoelectric ceramics element of the microactuator device. During the operation of the microactuator device 2, the potential free particles 12 may be gradually detached as the released particles with the lapse of time.

Figure 6:
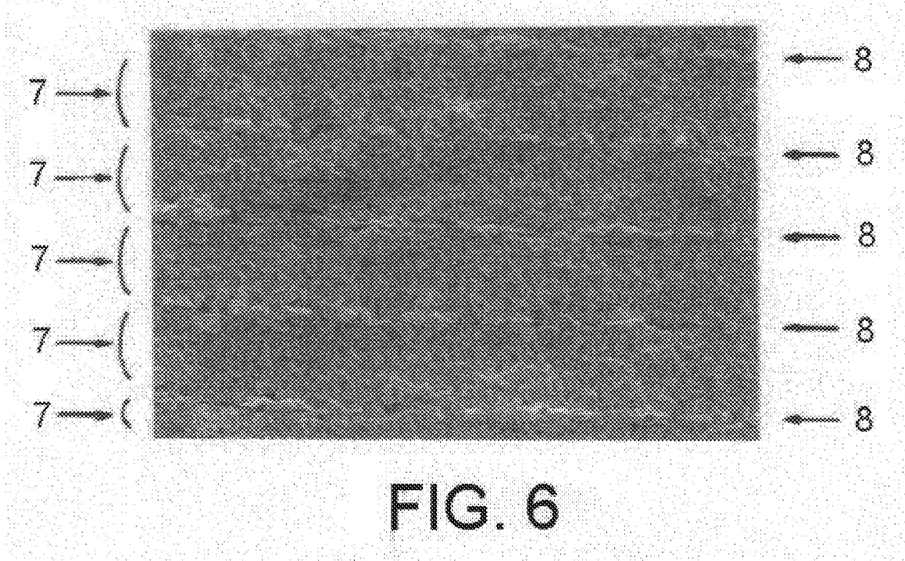
FIG. 6 is a photomicrograph of the cut face shown in FIG. 3 after the microactuator device is used or operated.

Referring to FIG. 6, the head supporting arrangement comprising the microactuator device 2 illustrated in FIG. 3 is driven (used) for a predetermined time period and then the broken face of the microactuator device 2 is observed by the scanning electron microscope in the observing direction M shown in FIG. 2. As seen from FIG. 6, it is confirmed that a large number of the free particles 11 and a large number of potential free particles 12 are confirmed on the microactuator device 2 at the piezoelectric ceramics elements 7 and the internal electrodes 8 after the microactuator device 2 is used. From this, it is understood that, if the microactuator device 2 is produced by breaking the multilayer structure after baking and if the microactuator device 2 is used without any treatment, a large number of the free particles 11 and a large number of the potential free particles 12 are present on the broken face and may damage the surface of the recording medium as the released particles.

Figure 7:
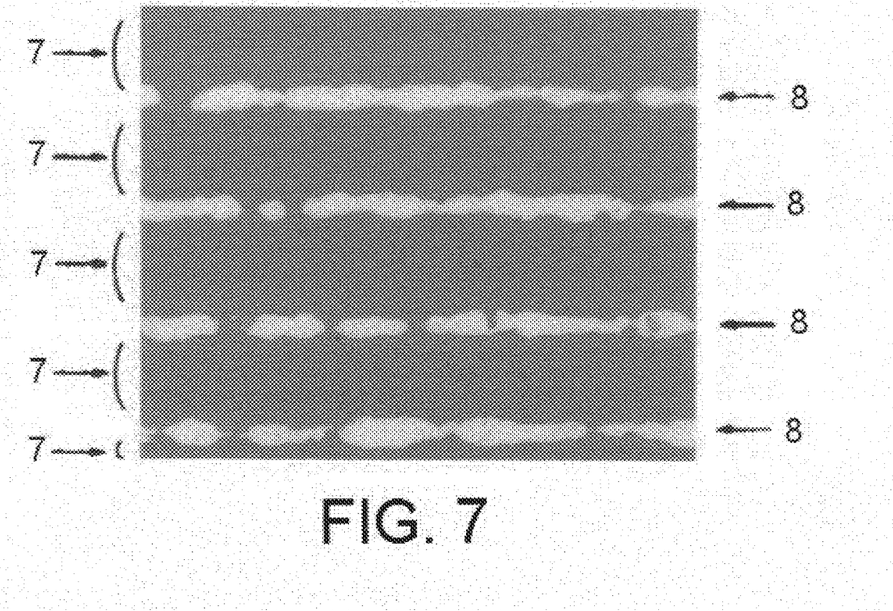
FIG. 7 is a photomicrograph of the cut face of the microactuator device after subjected to an example of the anti-release treatment.

Referring to FIG. 7, the microactuator device 2 subjected to a first example of the anti-release treatment is observed by the scanning electron microscope in the observing direction M shown in FIG. 2. The microactuator device 2 is obtained by partially breaking the multilayer structure after baking, cutting the multilayer structure into the predetermined shape and the predetermined size, and carrying out the anti-release treatment of the entire surface including the cut face by polishing. As seen from FIG. 7, the free particles and the potential free particles are not exposed on the cut face of the microactuator device 2 at the piezoelectric ceramics elements 7 and the internal electrodes 8. Thus, in case where the microactuator device 2 is formed by partially breaking the multilayer structure after baking, cutting the multilayer structure, and then polishing the multilayer structure, no substantial amount of the free particles and the potential free particles are present on the cut face and the finished condition on the surface of the microactuator device 2 is excellent. The finished condition on the surface of the microactuator device 2 can be improved, for example, by polishing the entire surface of the device by the use of a barrel.

Figure 8:
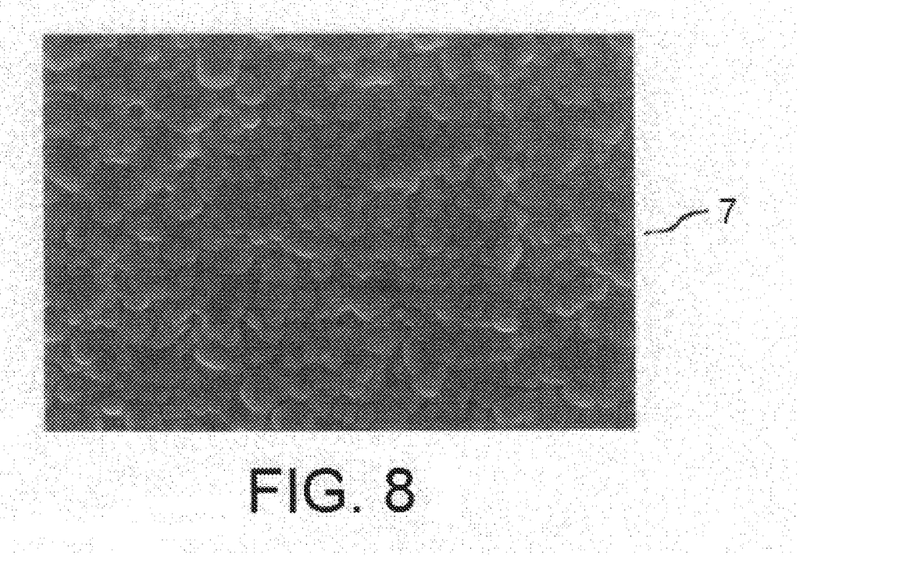
FIG. 8 is a photomicrograph of the cut face of the microactuator device after subjected to another example of the anti-release treatment.

Referring to FIG. 8, the microactuator device 2 subjected to a second example of the anti-release treatment is observed by the scanning electron microscope in the observing direction M shown in FIG. 2. The microactuator device 2 is obtained by partially breaking the multilayer structure, cutting the multilayer structure into the predetermined shape and the predetermined size, and carrying out the anti-release treatment by baking the entire surface including the cut face to form a sintered surface. In FIG. 8, only a part of the cut face of the microactuator device 2 at the piezoelectric ceramics element 7 is enlarged. As seen from FIG. 8, it is understood that, if the entire surface of the microactuator device 2 is baked as the sintered surface after the multilayer structure is cut into the final product shape and if cutting is no longer carried out after the microactuator device 2 is finished by baking, the free particles and the potential free particles are not exposed. This is because, as generally known, ceramics particles on the sintered surface of the piezoelectric elements 7 of a ceramics material react with one another by sintering to be brought into a stable condition. Comparison between the cut face at the piezoelectric ceramics element 7 in FIG. 5 and the sintered surface in FIG. 8 clearly shows the difference in ceramics surface. Thus, it is easily discriminated whether or not the anti-release treatment by baking the entire surface of the device as the sintered surface is applied.

Figure 9:
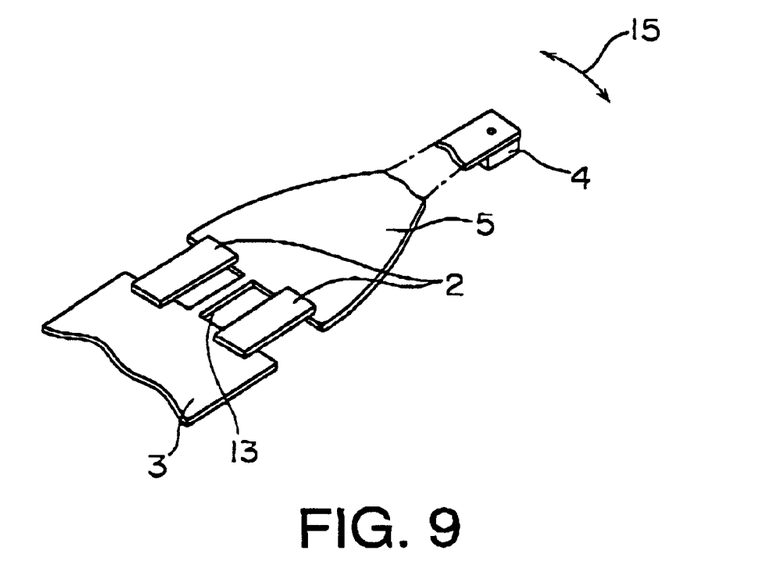
FIG. 9 is a perspective view of a characteristic part of a head supporting arrangement for use in a disk recording apparatus according to another embodiment.

Referring to FIG. 9, description will be made of a head supporting arrangement for use in a disk recording apparatus according to another embodiment of this invention. Similar parts are designated by like reference numerals and will not be described any longer.

As illustrated in FIG. 9, the head supporting arrangement has a two-stage positioning mechanism which will presently be described in detail. The head supporting arrangement comprises a suspension having one end as a fixed or supported end and the other end as a free end where a head 4 is mounted. At a first stage, the suspension is moved to position the head 4. At a second stage, the relationship in horizontal position between a recording medium (not shown) such as a rotary disk and the head 4 is finely adjusted by two microactuator devices 2. In the suspension, a support spring 5 is elastically connected to a base plate 3 through a narrow connect spring 13. The base plate 3, the support spring 5, and the connect spring 13 can be formed integral with one another. The head 4 is mounted at an end of the support spring 5.

On both sides of the connect spring 13, the microactuator devices 2 described in conjunction with FIG. 2 are arranged. A combination of the base plate 3, the support spring 5, the connect spring 13, and the microactuator devices 2 forms the above-mentioned suspension.

Figure 10:
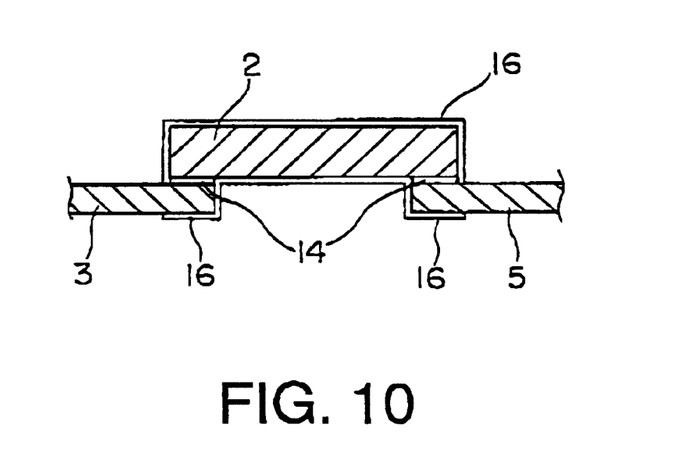
FIG. 10 is an enlarged sectional view of a characteristic part of the head supporting arrangement in FIG. 9.

Referring to FIG. 10, each of the microactuator devices 2 is located on the base plate 3 and the support spring 5 in a bridging condition and is bonded to each of the base plate 3 and the support spring 5 by the use of an adhesive 14. Preferably, the adhesive 14 exactly transmits the displacement of the microactuator devices 2 to the base plate 3 and the support spring 5 without attenuation. As the adhesive 14, use may be made of EpiFine 4616 Series manufactured by Fine Polymers Corporation. Thus, following a predetermined operation of at least one of the microactuator devices 2, the magnetic head 4 is finely displaced in a direction depicted by a double-headed arrow 15 in FIG. 9 typically in a plane parallel to the recording medium. It is also possible to finely displace the magnetic head 4 in a direction perpendicular to the recording medium. Thus, the position of the magnetic head 4 can be finely adjusted.

Furthermore, the microactuator devices 2 are coated with a coating film 16 collectively with portions of the base plate 3 and the support spring 5 which are adjacent to the microactuator devices 2. For example, the coating film 16 can be obtained by vapor deposition of a coating material "diX (Registered Trademark)" manufactured by Daisan Kasei, Ltd. Thus, a thin and compact coating film of about 10 $\mu$m thick can be formed even if the microactuator devices 2, the base plate 3, and the support spring 5 have uneven surfaces.

The coating film 16 serves to prevent fall of the released particles from the microactuator devices 2. Therefore, the recording medium used in the disk recording apparatus is prevented from being damaged by the released particles.

The coating film 16 also serves to prevent short-circuiting between internal electrodes due to dew formation or the like. This reduces the possibility of suppressing inherent functions of the microactuator devices 2.

Figure 11:
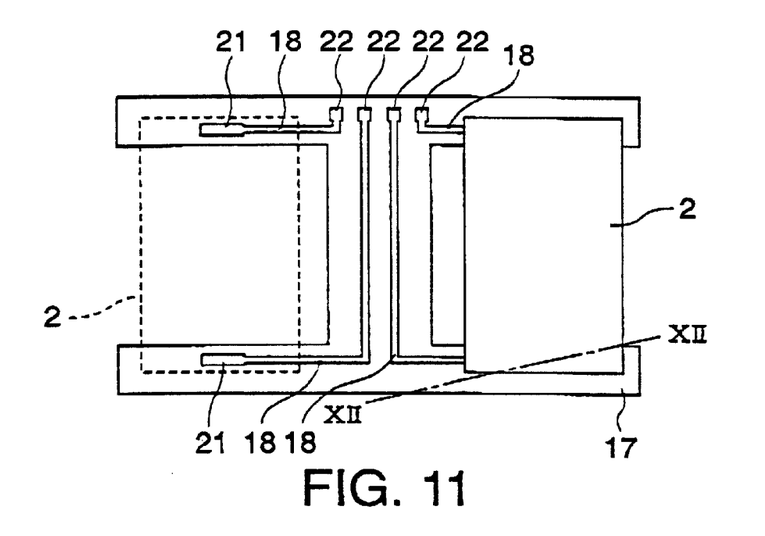
FIG. 11 is a plan view for describing a fixing structure of the microactuator device in the head supporting arrangement illustrated in FIG. 9.
Figure 12:
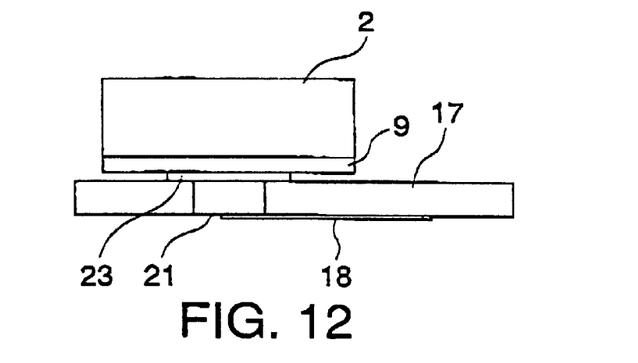
FIG. 12 is a sectional view taken along a line XII—XII in FIG. 11.

Referring to FIGS. 11 and 12 in addition to FIG. 9, description will be made of a specific example of a fixing structure of the microactuator devices 2. In FIG. 11, one of the microactuator devices 12 is shown by solid lines and the other is shown by broken lines.

In order to connect the microactuator devices 2 between the base plate 3 and the support spring 5, a flexible substrate 17 having an H shape in plan view is used. The flexible substrate 17 is provided with a plurality of circuit patterns 18. Each of the circuit patterns 18 has a device terminal 21 to be connected to the microactuator device 2 and a circuit terminal 22 to be connected to a drive circuit (not shown).

The circuit terminals 22 are concentrated and therefore easily connected to the drive circuit.

The microactuator devices 2 are mounted on the flexible substrate 17 with their external electrodes 9 electrically connected to the device terminals 21 by the use of a conductive adhesive 23. In this state, the two microactuator devices 2 and the flexible substrate 17 are coated with a coating film. For example, the coating film can be obtained by vapor deposition of the coating material diX (Registered Trademark) manufactured by Daisan Kasei, Ltd.

The coating film serves to prevent fall of the released particles from the microactuator devices 2. Therefore, the recording medium used in the disk recording apparatus is prevented from being damaged by the released particles. The coating film also serves to prevent short-circuiting between the internal electrodes due to the dew formation or the like. This reduces the possibility of suppressing the inherent functions of the microactuator devices 2.

Figure 13:
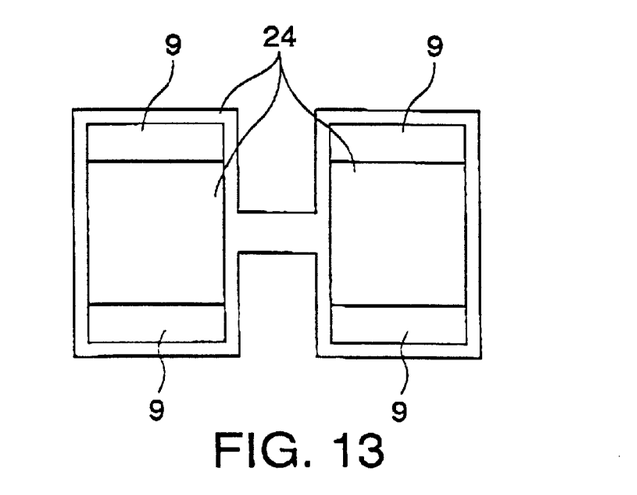
FIG. 13 is a plan view for describing another fixing structure of the microactuator device in the head supporting arrangement illustrated in FIG. 9.

Referring to FIG. 13, description will be made of another specific example of the fixing structure of the microactuator devices 2. In this example, the two microactuator devices 2 are connected at portions where a resin coating agent is hardened or cured without using the flexible substrate.

At first, the two microactuator devices 2 are arranged in parallel. A resin coating agent of an ultraviolet-setting type is applied throughout the entirety. Thereafter, ultraviolet rays are irradiated along the microactuator devices 2. At this time, the ultraviolet rays are not irradiated to those portions corresponding to the external electrodes 9. Subsequently, an uncured portion of the resin coating agent is washed off to form a resin coating portion 24. In this manner, the microactuator devices 2 can be coated with a coating film. The two microactuator devices 2 are connected by a bridging portion 25 formed by the resin coating agent applied and cured.

The resin coating portion 24 may be formed in the following manner. The microactuator devices 2 has nodal points as vibration nodes of piezoelectric vibration. The nodal points are bonded and fixed by an elastic bar. A part of each external electrode 9 is exposed and a remaining part is masked. Thereafter, picking and holding the elastic bar, the microactuator device is dipped in a resin bath to apply the resin to the microactuator devices 2. Thereafter, the resin is cured. In this manner also, the microactuator devices 2 are coated with the coating film.

The disk recording apparatus may be a magnetic disk apparatus for recording and reproducing data into and from a magnetic disk. In this event, the head is a magnetic head.

As described above, according to this invention, the microactuator device with the countermeasure for the particles on the cut face formed by cutting (or splitting), the head supporting arrangement using the microactuator device, and the disk recording apparatus using the microactuator device can be provided.

What is claimed is:

1. A head supporting arrangement comprising:
   a base plate;
   a support spring; and
   at least one microactuator device connected between said base plate and said support spring,
   wherein said microactuator device and portions of said base plate and said support spring adjacent to said microactuator device are coated with a coating film so that said microactuator device is entirely enclosed by said coating film.

2. A head supporting arrangement comprising:
   a base plate;
   a support spring; and
   a plurality of microactuator devices connected between said base plate and said support spring,
   wherein said microactuator devices and portions of said base plate and said support spring adjacent to each of said microactuator device are coated with a coating film so that each of said microactuator devices in entirely enclosed by said coating film.

3. A head supporting arrangement according to claim 2, further comprising a flexible substrate on which said microactuator devices are mounted, said flexible substrate being connected between said base plate and said support spring and being coated with said coating film together with said microactuator devices.

4. A head supporting arrangement according to any one of claims 1 through 3, wherein said support spring is elastically coupled to said base plate.

5. A disk recording apparatus comprising:
   the head supporting arrangement according to any one of claims 1 through 3; and
   a head supported by said support spring of said head supporting arrangement to access to a rotary disk,
   wherein the microactuator device of said head supporting arrangement is adapted to carry out fine adjustment of a positional relationship of said head with respect to said disk.

6. A disk recording apparatus according to claim 5, wherein said head comprises a magnetic heed.

7. A disk recording apparatus comprising:
   the head supporting arrangement according to claim 4; and
   a head supported by said support spring of said head supporting arrangement to access a rotary disk,
   wherein the microactuator device of said head supporting arrangement is adapted to carry out fine adjustment of a positional relationship of said head with respect to said disk.

* * * * *